US007571367B2

(12) United States Patent
Selva et al.

(10) Patent No.: US 7,571,367 B2
(45) Date of Patent: Aug. 4, 2009

(54) BUILT-IN SELF DIAGNOSIS DEVICE FOR A RANDOM ACCESS MEMORY AND METHOD OF DIAGNOSING A RANDOM ACCESS

(75) Inventors: Carolina Selva, Cologno Monzese (IT); Rita Zappa, Milan (IT); Danilo Rimondi, Mozzo (IT); Cosimo Torelli, Cernusco Sul Naviglio (IT); Giovanni Mastrodomenico, Vimercate (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 553 days.

(21) Appl. No.: 11/197,910

(22) Filed: Aug. 5, 2005

(65) Prior Publication Data
US 2006/0028891 A1   Feb. 9, 2006

(30) Foreign Application Priority Data
Aug. 5, 2004   (EP)   ................................. 04425613

(51) Int. Cl.
*G01R 31/28* (2006.01)

(52) U.S. Cl. .................. 714/733; 714/734; 714/30; 714/718

(58) Field of Classification Search ............. 714/718, 714/733, 734, 30
See application file for complete search history.

(56) References Cited

U.S. PATENT DOCUMENTS

| 5,530,805 | A | 6/1996 | Tanabe ................... 395/183.18 |
| 6,202,182 | B1 * | 3/2001 | Abramovici et al. ......... 714/725 |
| 6,665,817 | B1 * | 12/2003 | Rieken ......................... 714/30 |
| 2002/0031025 | A1 * | 3/2002 | Shimano et al. ............. 365/201 |
| 2003/0046621 | A1 | 3/2003 | Finkler et al. ................ 714/723 |
| 2004/0083407 | A1 | 4/2004 | Song et al. ..................... 714/27 |

OTHER PUBLICATIONS

Appello et al., A BIST-Based Solution for the Diagnosis of Embedded Memories Adopting Image Processing Techniques, Memory Technology, Design and Testing, Proceedings of the 2002 IEEE International Workshop on Jul. 10-12, 2002, pp. 12-16.
Chih-Wea et al., A Built-In-Self-Test and Self-Diagnosis Scheme for Embedded SRAM, Proceedings of the Ninth Asian Test Symposium IEEE Comput., SOC. Los Alamitos, CA, 2000, pp. 45-50.

* cited by examiner

*Primary Examiner*—Guy J Lamarre
(74) *Attorney, Agent, or Firm*—Lisa K. Jorgenson; Allen, Dyer, Doppelt, Milbrath & Gilchrist, P.A.

(57) ABSTRACT

A self diagnosis (BISD) device for a random memory array, preferably integrated with the random access memory, executes a certain number of predefined test algorithms and identifies addresses of faulty locations. The BISD device recognizes certain fail patterns of interest and generates bit-strings corresponding to them. In practice, the BISD device may diagnose memory arrays and allow the identification of defects in the production process that affect a new technology during its learning phase, thus accelerating its maturation.

17 Claims, 3 Drawing Sheets

BUILT-IN SELF DIAGNOSIS DEVICE FOR A RANDOM ACCESS MEMORY AND METHOD OF DIAGNOSING A RANDOM ACCESS

FIELD OF THE INVENTION

This invention relates to random access memory devices, and, in particular, to a built-in self diagnosis device for a random access memory and to a method of diagnosing a random access memory.

BACKGROUND OF THE INVENTION

In the last years the increased integration level of several devices on a single chip has allowed the reduction of the production costs and the manufacturability of more compact and complex products.

Reducing dimensions of devices requires even more sophisticated technologies that need to get stable before being used for mass production. Initially, the probability of failures is relatively large and the percentage of functioning devices is small. To increase the yield to stable values for production, a "learning phase" is used in which information on the critical points of the technology are analyzed.

The acquisition of information necessary for learning how to correct the manufacturing process is called "diagnosis", and its objective includes identifying the causes that generate the failures.

RAMs are ideal devices for testing whether a production process is mature or not. The static RAMs are the denser blocks, therefore their defects can be high, but the regularity of their structure allows associating to the address of the failing cell to the position of the defect in the matrix. With this association a defect in the array is correlated with a precise topologic configuration called a failure pattern and it is possible to easily get information on the structures that are more likely involved in the failure.

Diagnosis of memory devices starts with a test during which the addresses of the failing cells are collected. Then these addresses are elaborated for realizing a map of the failures, which is subsequently analyzed ("bitmap analysis") for recognizing recurrent failure patterns in a matrix of memory cells.

Approaches to the diagnosis belong to three different categories. The first is based only on the automatic test equipment (ATE). In this method all the tasks are performed by the ATE, from the test pattern generation to the failing addresses collection and bitmap elaboration.

A second approach shares the testing phases between DFT (Design For Testability) integrated test structures, using the so-called BIST (Built-In Self Test) devices, and the ATE (Automatic Test Equipment) devices. In this approach the BIST, integrated with the memory, generates patterns to stimulate the memory, and the ATE elaborates the bitmap that will be analyzed by the test engineer with the designer to identify the fail patterns.

In both these strategies the efficiency of the diagnosis is limited by the need to allocate dedicated resources to follow all these activities, by the large amount of time necessary for collecting data, and for the continuous interaction with the ATE.

The approaches based on the use of the ATE devices allows collection of all information available during the test. Unfortunately, the ATE devices are expensive and imply a bitmap analysis to be carried out by the test engineer and the designer for identifying recurrent failure patterns that take a relatively long time to be completed.

The third method is the so called drop-in approach that includes a test vehicle having the same pad frame of the product and containing sensitive SoC (System on Chip) modules directly accessible by the test equipments for yield monitoring. For instance, the drop-in includes static RAMs, analog blocks and standard cells. Of course, the drop-in usage, besides being silicon area consuming, suffers from the costs of the traditional ATE flow.

In D. Appello, A. Fudoli, V. Tancorre, F. Corno, M. Rebaudengo and M. Sonza Reorda, "A BIST-Based Solution for Diagnosis of Embedded Memories Adopting Image Processing Techniques", *Proceedings of 2002 IEEE International Workshop on Memory Technology, Design and Testing (MTDT)*, 2002, and T. J. Bergfeld, D. Niggemeyer and E. M. Rudnick, "Diagnostic Testing of Embedded Memories using BIST", *Design, Automation and Test in Europe (DATE), Proceedings*, pp. 305-309, 2000, a method of carrying out a diagnosis for embedded memory devices by using a BIST is disclosed. The memory to be tested is analyzed with a certain algorithm and the addresses of failures is output toward dedicated diagnostic structures. The analysis of the failure pattern is performed successively.

In K. M. Butler, K. Johnson. J. Platt, A. Kinra, and J. Saxena, "Automated Diagnosis in Testing and Failure Analysis", *IEEE Design & Test of Computers*, vol. 14, no. 3, pp. 83-89, 1997, a method of performing a diagnosis is disclosed. Addresses of failing memory cells are found implementing appropriate test algorithms by a BIST.

The approach disclosed in D. Niggemeyer and E. Rudnick, "Automatic Generation of Diagnostic March Tests", *IEEE VLSI Test Symposium (VTS), Proceedings*, pp. 299-304, 2001, contemplates the use of a BIST capable of performing on-line a set of instructions for carrying out diagnostic tests on SRAMs, and for collecting information on the detected failures. This approach is particularly useful with embedded devices because of the limited hardware resources they require.

Various approaches for the test and diagnosis of embedded SRAM are compared in T. W. Williams and K. P. Parker, "Design for Testability—A Survey", *Proceedings of the IEEE*, 71(1), pp. 98-111, 1983, and V. N. Yarmolik, Y. V. Klimets, A. J. van de Goor and S. N. Demidenko, "RAM Diagnostic Tests", *Proceedings of the IEEE International Workshop on Memory Technology, Design and Testing (MTDT)*, pp. 100-102, 1996. These articles highlight that the approaches based on integrated structures are more advantageous than the approaches based on ATE devices.

In J. Segal, A. Jee, D. Lepeiian and B. Chu, "Using Electrical Bitmap results from Embedded Memory to Enhance Yield", *IEEE Design & Test of Computers*, vol. 18, no. 3, pp. 28-29, 2001, the problem of performing a diagnosis of SRAMs by bitmap analysis is discussed. This article shows that the correlation between defects and failure patterns is usually strong.

The documents R. Treuer and V. K. Agarwal, "Built-In Self Diagnosis for Repairable Embedded RAMs", *IEEE Design & Test of Computers*, vol. 10, no.2, pp.24-33, 1993, and R. P. Treuer and V. K. Agarwal, "Fault Location Algorithms for Repairable Embedded RAMs", *IEEE International Test Conference (ITC), Proceedings*, pp. 825-834, 1993, highlight that a diagnosis of failures even in a repair process of embedded memory devices would be needed.

SUMMARY OF THE INVENTION

In view of the foregoing background, the present invention provides a self diagnosis (BISD) device for a random memory array and a method of diagnosing a random memory array.

The BISD device of the invention, preferably integrated with the random access memory, executes a certain number of predefined test algorithms and identifies addresses of faulty locations. According to the method of the invention, the BISD device is adapted to recognize certain failure patterns of interest and generate bit-strings corresponding to them. In practice, the BISD device automatically diagnoses memory arrays and allows identification of defects in the production process that affect a new technology during its learning phase, thus accelerating its "maturation".

This invention provides also a method of diagnosing a random access memory array, comprising executing any of a certain number of predefined test algorithms and subsequently checking the correctness of output data read from the memory array, and identifying any address of the tested array found to be faulty. The method may also include analyzing the distribution of failing bits, and verifying whether there are failing bits defining pre-established failure patterns and eventually generating bit-strings corresponding to the recognized failure patterns.

BRIEF DESCRIPTION OF THE DRAWINGS

The various aspects and advantages of this invention will be even more evident through a detailed description referring to the attached drawings, wherein.

DETAILED DESCRIPTION OF THE PREFERRED EMBODIMENTS

The BISD machine performs all the steps for the diagnosis: generates the stimuli for the memory test, collects and elaborates the results and directly produces the list of failure patterns, that are stored in dedicated registers. The main features of this BISD are the usage of a programmable BIST, flexibility in defining address scrambling, and definition of a sub-array to be verified.

The possibility of choosing a sub-array for the diagnosis allows selection of the maximum diagnostic resolution in the early phase of a new technology growth, then considering testing time, and to perform the test at the maximum speed, using a low diagnostic resolution, in case of well located failures in a product.

The BISD can be integrated with memories up to 64K words, each word having a size variable from 4 to 32 bits. The allowed scrambling can be periodic, on 8 rows and 8 columns. The test can be run on the whole memory array or on a sub-array, specifying the bit interval that includes the cells under test.

Figure 1:
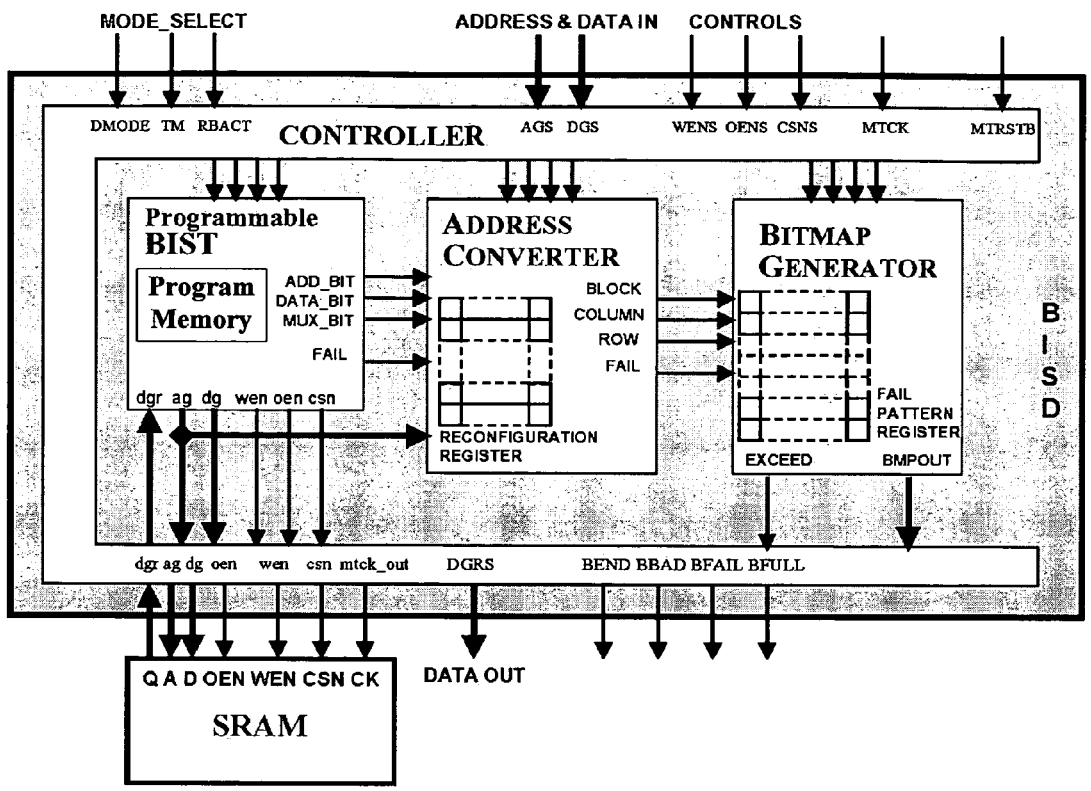
FIG. 1 depicts a basic scheme of a BISD device of this invention.

FIG. 1 shows a block diagram of the BISD device connected to an embedded synchronous static RAM. The BISD machine includes 4 blocks: the Controller, the Address Converter, the Bitmap Generator and the programmable BIST.

The only signals added for this BISD, with respect to the embedded BIST block, are dmode and bfull. The signal dmode is an input signal that controls the enabling of the diagnostic phase and, together with the signals tm and rbact, determines the BISD operating mode. The signal bfull is an output signal used during the read operation of the internal registers that are described in the next section.

The BISD machine works with the same clock of the memory, so no additional clock is required. Table 1 shows the operating modes in which this system can work.

TABLE 1

| dmode | rbact | tm | Operating mode | Diagnosis | BIST | Memory |
|---|---|---|---|---|---|---|
| 0 | 0 | 0 | Transparent mode | Off | Off | Accessible |
| 0 | 0 | 1 | BIST Test | Off | On | Off |
| 0 | 1 | 0 | BIST Run | Off | On | On |
| 0 | 1 | 1 | BIST Program | Off | On | Off |
| 1 | 0 | 0 | BISD Read | On | Off | Off |
| 1 | 0 | 1 | BISD Test | On | On | On |
| 1 | 1 | 0 | BISD Run | On | On | On |
| 1 | 1 | 1 | BISD Program | On | Off | Off |

From this table it can be noticed that the integration of the BISD module still allows the memory to work in a Transparent mode. In the Transparent mode the memory is enabled and completely accessible through the normal control signals while the BISD and BIST machines are disabled.

For the memory under verification there is the possibility to be tested directly with the BIST, or to be analyzed through the BISD flow.

Choosing the BIST Run mode, the memory is tested by the BIST, according to the selected algorithm and the BISD machine is disabled. In BIST Program mode the test code is loaded in the program memory. For the diagnostic tests, BISD Program and BISD Run modes are needed. The BISD Program is the operation mode that allows to program the BISD with the information related to the memory architecture, address scrambling and array area to be verified.

In BISD Run mode, the memory is tested by the BISD machine. The BISD elaborates all the information generated by the BIST, storing in dedicated registers the failing configurations found. At the end of the BISD Run phase the BISD Read mode is enabled to download the contents of these registers to the ATE. Furthermore, there is the possibility to control directly the correct operation of BIST block and of the BISD through the "testing modes".

The BIST Test mode allows verification of the stimuli generated by the BIST.

As for the BIST, also the BISD can be controlled from the external pins in the BISD Test mode. In this case it is possible to check the address under analysis and the data read from the SRAM. During this mode it is also possible to transfer to the ATE the addresses of the failing cells with their corresponding contents, allowing a parallel data elaboration with the ATE resources in case of their availability.

Figure 5:
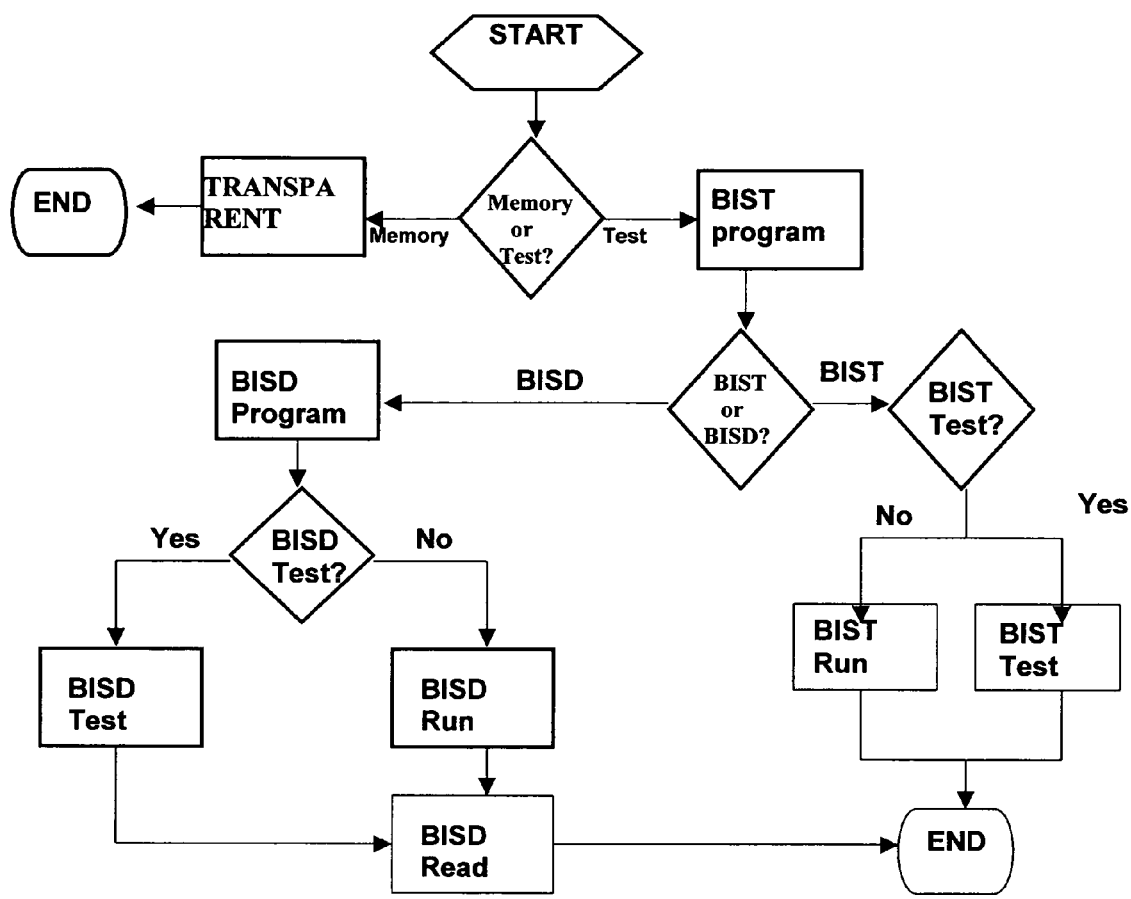
FIG. 5 is a flow chart of the functioning of the BISD device of this invention.

FIG. 5 is a flow chart that shows the functioning of the BISD device. The sample embodiment of FIG. 1 includes four blocks, each performing a respective operation necessary to diagnose a SRAM.

Programmable BIST

The characteristic of the BIST is the flexibility with respect to the test algorithms and to the size of the memory under test. These data have to be programmed in the Program memory of the BIST before starting the BIST Run or BISD Run operations. This phase is accomplished during the BIST Program mode.

In this Program memory the instructions of 4 different algorithms, all based on March-like steps are coded. The algorithms implemented are March 17N, Pattern Sensitive Fault (PSF), Weight Sensitive Fault (WSF) and Data Retention as discussed in M. Nicolaidis, "Transparent BIST for RAMS", *International Test Conference*, pp. 598-607, 1992; M. G. Karpovsky, V. N. Yarmolik, "Transparent Memory Testing for Pattern Sensitive Faults", *International Test Conference*, pp. 860-869, 1994; and M. Franklin, K. Saluja and K. Kinoshita "Design of a BIST RAM with Row/Column Pattern Sensitive Faults Detection Capability", *International Test Conference*, pp. 327-336, 1989. All of these algorithms assure a full fault coverage.

Controller

The Controller is the unit that manages the communications between the various blocks and the environment and drives the system in the BISD operation mode chosen, according to values of the signals dmode, rbact and tm.

Address Converter

Once the BISD diagnostic mode is selected, the Address Converter block is enabled. Through this module the logic addresses generated by the BIST are converted into the physical addresses to have the effective representation of the failure pattern in the memory array.

Without this conversion it would not be possible to recognize failure patterns corresponding to physically adjacent cells because the effective position of the cells in a memory matrix in general does not correspond to the logic disposition of cells according to the memory addresses. Considering that memory devices may have an address scrambling, this conversion is performed preferably by using an internal de-scrambling table.

The content of this table is stored in the Reconfiguration Register that is implemented in the Address Converter block. The Reconfiguration Register, shown in Table 2, is a register of 10 words of 6 bits each, the first 8 words are dedicated to the de-scrambling table and the last 2 words are dedicated to storing information related to the portion of the array to be diagnosed and to the kind of order (increasing or decreasing) of the bits in the banks.

TABLE 2

| Address | Bit 5 | Bit 4 | Bit 3 | Bit 2 | Bit 1 | Bit 0 |
|---|---|---|---|---|---|---|
| 0 | Physical column of the cell 0 | | | Physical row of the cell 0 | | |
| from 1 to 7 | Physical column of the cell 1 to 7 | | | Physical row of the cell 1 to 7 | | |
| 8 | Bit order | First bit | | | | |
| 9 | — | Last bit | | | | |

The Address Converter may be re-configured as a function of the characteristics of the memory to which the BISD is interfaced. This may be done by rewriting the Reconfiguration Register to store information about the scrambling and the disposition of memory blocks before starting the test. The second task of the Address Converter block is to extract from the data generated by the BIST the data needed for the execution of the diagnostic analysis and to transfer this data to the Bitmap Generator block.

Bitmap Generator

Figure 3:
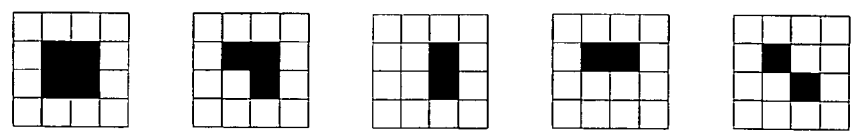
FIGS. 3 and 4 show-failure patterns that can be recognized by the BISD device of this invention.
Figure 4:
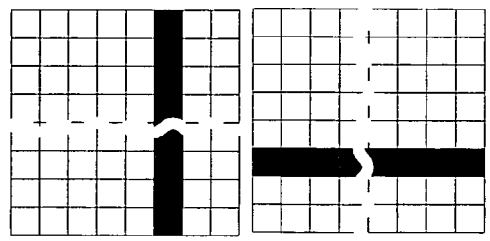

The Bitmap Generator stores in dedicated registers the information related to the failures that have occurred during the test. The configurations recognized are shown in FIGS. 3 and 4: groups of four, three or two adjacent cells, single columns or couple of columns, complete or partial rows. This block detects the topologic configuration starting from the signals produced by the Address Converter and from the information on the memory architecture provided by the BIST.

During the elaboration of the BIST results, the testing execution is stopped to allow the data processing and the updating of the contents of the registers. After this phase, the Bitmap Generator block downloads on the output bus the contents of the registers. This is done in the BISD Read mode. Table 3 shows the information stored in the registers for each class of failing configuration. This information includes the position of the failing cell, the topology of the failure and the flag indicating if the register is full.

TABLE 3

| 4 Cell Column Row | Status Status Status | Q Bitmap C Bitmap Word | Bit Bit Row | Row Column | Column |
|---|---|---|---|---|---|

Figure 2:
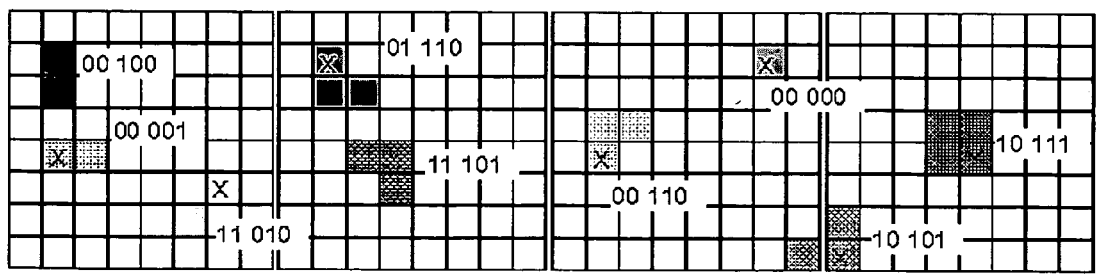
FIG. 2 shows failure patterns recognized and encoded with a respective bit-string by the BISD device of this invention.

For a four cell failure, "Q bitmap" indicates if the configuration found corresponds to four, three or two cells. In FIG. 2 there are some examples of failing cells and the related code for classifying the failure pattern. For a column failure "C bitmap" codes a single or a couple of column failures, while for a row failure "Word" codes the failure of a row or of at least one word in the row.

The following table illustrates the meaning of the signals shown in FIG. 1.

TABLE 4

| SIGNAL | DESCRIPTION |
|---|---|
| DMODE | Diagnostic mode |
| TM | Test mode |
| RBACT | Run BIST active |
| AGS | Address bus |
| DGS | Data bus |
| WENS | Write enable |
| OENS | Output enable |
| CSNS | Chip select enable |
| MTCK | Master clock |
| MTRSTB | Master reset |
| ADD_BIT | Address failing bit |
| DATA_BIT | Data failing bit |
| MUX_BIT | Mux |
| FAIL | Data compare result |
| BLOCK | Block failing |
| COLUMN | Physical column failing |
| ROW | Physical row failing |
| DGR | Output data bus |
| AG | Address bus |
| DG | Input data bus |
| WEN | Write enable |
| OEN | Output enable |
| CSN | Chip select enable |
| MTCK_OUT | Master clock for the Memory |
| DGRS | Data bus |
| BEND | BISD end |
| BBAD | BISD bad |
| BFAIL | BISD fail |
| BFULL | BISD full |

TABLE 4-continued

| SIGNAL | DESCRIPTION |
|---|---|
| EXCEED | END read operation |
| BMPOUT | Output data - BITMAP registers |
| Q | Output data bus |
| A | Address bus |
| D | Input data bus |
| OEN | Output enable |
| WEN | Write enable |
| CSN | Chip select enable |
| CK | clock |

Fault Classification

The memory diagnosis flow is based on the correspondence between defects and failure patterns and requires a preliminary deep analysis of all the possible defects and associated failing bit configurations. The structure of the single cell is rotated and replicated more times in the manufacturing of the matrix to obtain the largest density and allowing adjacent cells to share certain structures, thus it may likely happen that a failure in one of these structures will cause a failure in all cells that use the failing structure.

For instance, let us consider the case in which a defect is generated in the region shared by two cells of the same column. Very likely, both these cells will not work correctly and a vertical pair of failing bits will be detected.

The following set of fault patterns configurations has been considered as the most critical:
 groups of 4, 3, 2 adjacent cells;
 single or 2 adjacent failing columns; and
 whole failing rows or at least one word failing on the same row as shown in FIGS. 3 and 4. In this way it is possible to detect defects in the memory array, in the array periphery and in the decoding circuitry.

The identification of the address and bit failing is done through a set of algorithms programmed in the BIST. These algorithms can detect the following faults: stuck-at-fault, stuck-open fault, transition fault, coupling fault, multiple access fault, pattern sensitive fault, weight sensitive fault, and data retention fault.

Simulations and Silicon Results

To verify the functionality of this design, the diagnosis of each fail pattern configuration has been checked by simulating faults in the memory. In this section an example of this verification approach is described.

To simulate a full column failure a stuck-at-0 fault in all the cells of the column 11 of the bit 9 has been injected. The March 17N algorithm detects this failure, when the data background applied is the vector AAAA[H]. The signature in the column register is 89000B. In this signature the less significant bits 0B[H] represents the value of the failing column, while the most significant bits 89[H] store the information about the failing bit and the status of the register.

The BISD module has been tested on silicon. The 512 Kbit static RAM associated to the BISD has shown failures of couple of diagonal and horizontal adjacent bits and full row failures. All these failures have been detected by the BISD and, using the fault dictionary built in advance, it has been possible to get immediately the physical causes that have generated these failures.

The proposed BISD device may be easily adapted to memory devices of different dimensions (up to 64 k words with variable dimension between 4 and 32 bit), different architecture (multiplexers with a power from 2 to $2^{16}$) and address scrambling (provided it is periodic over eight rows and eight columns). Moreover it is adapted to test the whole memory array or on portions of the same by selecting the bit interval to be verified.

Benefits and Implementation Costs

Figure 6:
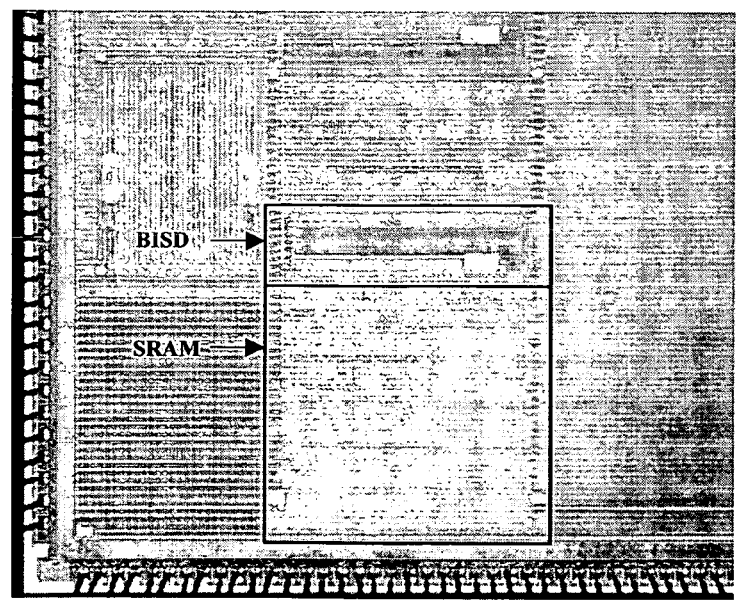
FIG. 6 is a microphotograph of a test chip used for simulations of this invention.

The BISD design described has been implemented in a 0.13 μm non-volatile technology for a 512 Kbit static RAM. In FIG. 6 is shown a microphotograph of this Test Chip in which this module has been integrated. The BISD block and the SRAM interface are highlighted.

The costs of this design in terms of number of additional pins and area overhead are the following. This design introduces only two more pins with respect to the pins needed for the BIST, and the area overhead of this block is 13%. The costs of this extra area should be evaluated with the costs of the traditional approaches both in terms of test equipment and in terms of dedicated resources.

All the activities related to the testing program development and debugging, test patterns writing, address scrambling implementation, bitmap acquisition, analysis and data collecting, that are currently accomplished by test engineers, are completely integrated inside the BISD and automatically run just enabling the BISD operation. Moreover, it is important to notice that all these testing and diagnostic steps have already been validated during the design phase of the BISD module. Therefore this approach is less error prone.

With respect to the previous approaches in this field, this BISD design has two main advantages. The first is to perform a fully integrated memory diagnosis, because the ATE has only to store the information downloaded from the dedicated registers implemented into the BISD machine. The second important characteristic of this BISD is the programmability. This means flexibility with respect to the test algorithms, size and architecture of the memory under test and for the subarray to be tested and diagnosed. A further advantage of this approach is the independence from the specific ATE platform because the BISD flow may not require a continuous access to the ATE.

That which is claimed is:

1. A built-in self diagnosis (BISD) device for a memory array and comprising:
    a built-in self test (BIST) structure being programmable to execute a plurality of different test algorithms, each test algorithm comprising a series of respective test steps to be sequentially performed without user input on the memory array to determine addresses of failures of the memory array; and
    a circuit coupled to said BIST structure that receives addresses of failures of the memory array, analyzes a distribution of the failures, recognizes whether the failures are in accordance with at least one failure pattern, and stores bit-strings corresponding to the failures in accordance with the at least one failure pattern.

2. The BISD device according to claim 1 wherein said circuit comprises an address converter input with addresses of failures and outputting corresponding physical addresses of the addresses of the failures.

3. The BISD device according to claim 2 wherein said circuit further comprises a bitmap generator comprising at least one internal register that analyzes a distribution of failures and verifies whether the failures are in accordance with the at least one failure pattern.

4. The BISD device according to claim 3 wherein said circuit further comprises a controller managing communications between said BIST structure, said address converter and said bitmap generator.

5. The BISD device according to claim 1 wherein the at least one failure pattern is at least one of a group of 2, 3 or 4 adjacent cells; a single failing column; two adjacent failing columns; a word failing on a same row; and a whole failing row.

6. An integrated circuit comprising:
a memory array; and
a built-in self diagnosis (BISD) device connected to said memory array and comprising
a built-in self test (BIST) structure being programmable to execute a plurality of different test algorithms, each test algorithm comprising a series of respective test steps to be sequentially performed without user input on the memory array to determine addresses of failures of the memory array, and
a circuit coupled to said BIST structure that receives addresses of failures of the memory array, analyzes a distribution of the failures, recognizes whether the failures are in accordance with at least one failure pattern, and stores bit-strings corresponding to the failures in accordance with the at least one failure pattern.

7. The integrated circuit according to claim 6 wherein said circuit comprises an address converter input with addresses of failures and outputting corresponding physical addresses of the addresses of the failures.

8. The integrated circuit according to claim 7 wherein said circuit further comprises a bitmap generator comprising at least one internal register that analyzes a distribution of failures and verifies whether the failures are in accordance with the at least one failure pattern.

9. The integrated circuit according to claim 8 wherein said circuit further comprises a controller managing communications between said BIST structure, said address converter and said bitmap generator.

10. The integrated circuit according to claim 6 wherein the at least one failure pattern is at least one of a group of 2, 3 or 4 adjacent cells; a single failing column; two adjacent failing columns; a word failing on a same row; and a whole failing row.

11. The integrated circuit according to claim 6 wherein said memory array comprises a static random access memory array.

12. A method of diagnosing a memory array using a built-in self diagnosis (BISD) device coupled thereto and being programmable to execute a plurality of test algorithms, the method comprising:
executing at least one of the plurality of different test algorithms, each test algorithm comprising a series of respective test steps to be sequentially performed without user input on the memory array to determine addresses of failures of the memory array, and subsequently checking correctness of output data from the memory array;
identifying each address of the memory array found to include a failure;
analyzing a distribution of failures; and
verifying whether the failures match at least one failure pattern and generating bit-strings corresponding to the failure pattern.

13. The method according to claim 12 wherein the at least one failure pattern is at least one of a group of 2, 3 or 4 adjacent cells; a single failing column; two adjacent failing columns; a word failing on a same row; and a whole failing row.

14. The method according to claim 12 wherein the BISD device comprises a built-in self test (BIST) structure; and further comprising programming the BIST structure with the at least one test algorithm.

15. A method of identifying defects in an integrated circuit production process comprising:
forming an integrated circuit including a memory array and a built-in self diagnosis (BISD) device coupled to the memory array thereto and being programmable to execute a plurality of different test algorithms, each test algorithm comprising a series of respective test steps to be sequentially performed without user input on the memory array to determine addresses of failures of the memory array;
operating the BISD device to execute at least one test algorithm, analyze a distribution of failures, recognize whether the failures are in accordance with at least one failure pattern, and store bit-strings corresponding to the failures in accordance with the at least one failure pattern; and
adjusting the integrated circuit production process based upon the stored bit-strings.

16. The method according to claim 15 wherein the at least one failure pattern is at least one of a group of 2, 3 or 4 adjacent cells; a single failing column; two adjacent failing columns; a word failing on a same row; and a whole failing row.

17. The method according to claim 15 wherein the BISD device comprises a built-in self test (BIST) structure; and further comprising programming the BIST structure with the at least one test algorithm.

* * * * *

UNITED STATES PATENT AND TRADEMARK OFFICE
CERTIFICATE OF CORRECTION

| | | |
|---|---|---|
| PATENT NO. | : 7,571,367 B2 | Page 1 of 1 |
| APPLICATION NO. | : 11/197910 | |
| DATED | : August 4, 2009 | |
| INVENTOR(S) | : Selva et al. | |

It is certified that error appears in the above-identified patent and that said Letters Patent is hereby corrected as shown below:

Title Page, Section 54 (title)   Delete: "BUILT-IN SELF DIAGNOSIS DEVICE FOR A RANDOM ACCESS MEMORY AND METHOD OF DIAGNOSING A RANDOM ACCESS"

Insert: -- BUILT-IN SELF DIAGNOSIS DEVICE FOR A RANDOM ACCESS MEMORY AND METHOD OF DIAGNOSING A RANDOM ACCESS MEMORY --

Column 1, Line 1 (title)   Delete: "BUILT-IN SELF DIAGNOSIS DEVICE FOR A RANDOM ACCESS MEMORY AND METHOD OF DIAGNOSING A RANDOM ACCESS"

Insert: -- BUILT-IN SELF DIAGNOSIS DEVICE FOR A RANDOM ACCESS MEMORY AND METHOD OF DIAGNOSING A RANDOM ACCESS MEMORY --

Signed and Sealed this

Fifteenth Day of December, 2009

David J. Kappos
*Director of the United States Patent and Trademark Office*